(12) United States Patent
Nowak et al.

(10) Patent No.: US 6,426,278 B1
(45) Date of Patent: Jul. 30, 2002

(54) PROJECTION GAS IMMERSION LASER DOPANT PROCESS (PGILD) FABRICATION OF DIFFUSION HALOS

(75) Inventors: Edward J. Nowak, Essex Junction; John J. Ellis-Monaghan, Grand Isle, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/413,997

(22) Filed: Oct. 7, 1999

(51) Int. Cl.[7] ............................................. H01L 21/425
(52) U.S. Cl. ........................................ 438/528; 438/530
(58) Field of Search ................................. 438/306, 520, 438/521, 522, 528, 529, 530, 555; 257/344, 345

(56) References Cited

U.S. PATENT DOCUMENTS

| | | | |
|---|---|---|---|
| 4,395,773 A | * 7/1983 | Ravindhran et al. | 438/217 |
| 4,584,026 A | 4/1986 | Wu et al. | |
| 5,045,486 A | * 9/1991 | Chittipeddi | 438/231 |
| 5,254,484 A | 10/1993 | Hefner et al. | |
| 5,401,666 A | * 3/1995 | Tsukamoto | 438/305 |
| 5,563,440 A | 10/1996 | Yamazaki et al. | |
| 5,696,011 A | 12/1997 | Yamazaki et al. | |
| 5,744,841 A | 4/1998 | Gilbert et al. | |
| 5,885,886 A | * 3/1999 | Lee | 438/528 |
| 5,953,615 A | * 9/1999 | Yu | 438/303 |
| 6,017,798 A | * 1/2000 | Ilderem et al. | 438/286 |
| 6,180,476 B1 | * 1/2001 | Yu | 438/305 |

* cited by examiner

Primary Examiner—Carl Whitehead, Jr.
Assistant Examiner—Jeff Vockrodt
(74) Attorney, Agent, or Firm—DeLio & Peterson, LLC; Kelly M. Reynolds; Mark F. Chadurjian

(57) ABSTRACT

A method for fabricating FETs with abrupt halos provides an initial FET structure having a substrate, a dielectric layer over a portion of the substrate, a gate over the dielectric layer, sidewall insulators on either side of and adjacent the dielectric layer and gate, and halo regions comprising an n- or p-type dopant extending to a desired depth in the substrate adjacent each of the sidewall insulators and beneath a portion of the dielectric layer. The method is practiced by creating first amorphous regions within a portion of each of the halo regions to a depth less than the halo regions and implanting in and diffusing throughout only the first amorphous regions a dopant opposite the n- or p-type dopant used in the halo region to create extension source and drain regions. The method then involves forming dielectric spacers adjacent the sidewall insulators and creating second amorphous regions adjacent each of the dielectric spacers to a depth greater than the halo regions. Thereafter, there is implanted in and diffused throughout only the second amorphous regions a dopant opposite the n- or p-type dopant used in the halo region to create source and drain regions. The diffusion of dopant may be by laser annealing to locally melt only the amorphous region.

12 Claims, 2 Drawing Sheets

PROJECTION GAS IMMERSION LASER DOPANT PROCESS (PGILD) FABRICATION OF DIFFUSION HALOS

Background Of The Invention

1. Field of the Invention

The present invention relates to field effect transistors (FETs) in integrated circuit devices such as semiconductor chips and, in particular, to the formation of halo regions in FETs to moderate and control short-channel effects.

2. Description of Related Art

Halo regions, e.g., diffused boron, have been implanted adjacent the source and drain regions of FET integrated circuit devices in semiconductor chips, as disclosed in U.S. Pat. No. 5,744,841. Halos have been used in transistor device design to moderate short channel effects of advanced FETs devices with very short channel length. It has been found that halos also produce an unwanted phenomena called roll-up which degrades device performance. Roll-up refers to threshold voltages that initially increase as channel length decreases from what is considered a very long value for a given technology. Ultimately, as the channel length approaches the technology minimum, the short channel effect dominates and threshold voltage values rapidly decrease with decreasing channel length.

A method of forming diffusions for high performance FETs using a localized high energy laser has been previously proposed. This process is known as the Projection Gas Immersion Laser Dopant Process (PGILD). PGILD uses a masked laser to selectively dope regions on the wafer n-type or p-type by selectively projecting the laser on a semiconductor wafer through a mask, thus eliminating the need for photoresist and all of the associated tooling and processes for depositing, developing and stripping photoresist.

The PGILD process for forming diffusions can be summarized as follows. The silicon wafer surface to be doped is amorphized, i.e., converted to an amorphous state, usually by ion implantation. The wafer is exposed with a masked laser consistent with block level lithography specifications, in an ambient atmosphere containing an n-type or p-type dopant gases. This first laser exposure causes the dopant to precipitate onto the wafer surface, but without annealing the silicon so that it remains in its amorphous state. A second laser operating at a wavelength of, for example, 308 nm, is then used to anneal the silicon by locally melting the amorphous silicon. The amorphous silicon has a much lower melting point than single crystal silicon, and the energy dose is controlled so that the melting propagates to the amorphous-single crystal silicon (SCS) interface and stops, without melting the single crystal silicon. The surface dopants readily diffuse through the melt, but because the time at temperature is extremely short, do not diffuse into the single crystal silicon. As a result, highly doped, very shallow junctions are created.

Since halos created by the PGILD process are subject to the aforedescribed roll-up phenomena as channel length decreases, it would be advantageous to develop a process which overcomes the problem of the short channel effects and threshold voltage decrease with decreasing channel length.

Bearing in mind the problems and deficiencies of the prior art, it is therefore an object of the present invention to provide a process which overcomes the problem of the aforedescribed roll-up phenomena, including short channel effect and threshold voltage decrease with decreasing channel length.

It is another object of the present invention to provide an improved process for manufacturing FETs in integrated circuit devices using the PGILD process.

A further object of the invention is to provide a process for creating a more ideal halo in FETs.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for fabricating FETs with abrupt halos. Initially, there is provided an initial FET structure having a substrate, a dielectric layer over a portion of the substrate, a gate over the dielectric layer, sidewall insulators on either side of and adjacent the dielectric layer and gate, and halo regions comprising an n- or p-type dopant extending to a desired depth in the substrate adjacent each of the sidewall insulators and beneath a portion of the dielectric layer. The method is practiced by creating first amorphous regions within a portion of each of the halo regions to a depth less than the halo regions and implanting in and diffusing throughout only the first amorphous regions a dopant opposite the n- or p-type dopant used in the halo region to create extension source and drain regions. The method then involves forming dielectric spacers adjacent the sidewall insulators and creating second amorphous regions adjacent each of the dielectric spacers to a depth greater than the halo regions. Thereafter, there is implanted in and diffused throughout only the second amorphous regions a dopant opposite the n- or p-type dopant used in the halo region to create source and drain regions.

The halo regions in the initial FET structure may be formed by creating initial amorphous regions in the substrate adjacent the sidewall insulators using ion implantation and implanting an n- or p-type dopant within the initial amorphous regions and diffusing the dopant throughout substantially only the initial amorphous regions to create halo regions. The diffusion of dopant may be by laser annealing to locally melt only the amorphous region.

Preferably, the first amorphous regions and the dopant diffused therethrough extend beneath the sidewall insulators, and the second amorphous regions and the dopant diffused therethrough do not extend beneath the sidewall insulators. The halo region may be doped with a p-type dopant and the first and second amorphous regions may be doped with an n-type dopant to create an NFET, or the halo region may be doped with an n-type dopant and the first and second amorphous regions may be doped with a p-type dopant to create a PFET. Preferably, each of the halo regions and the source and drain regions have substantially uniform depths.

In a related aspect, the present invention provides a method for fabricating FETs with abrupt halos in which there is provided an initial FET structure having a substrate, a dielectric layer over a portion of the substrate, a gate over the dielectric layer, sidewall insulators on either side of and adjacent the dielectric layer and gate. The method includes creating initial amorphous regions in the substrate adjacent the sidewall insulators using ion implantation and implanting an n- or p-type dopant within the initial amorphous regions. The dopant is diffused throughout substantially only the initial amorphous regions by laser annealing to locally melt only the amorphous region to create halo regions extending to a desired depth in the substrate adjacent each of the sidewall insulators and beneath a portion of the dielectric layer. First amorphous regions are then created within a portion of each of the halo regions to a depth less than the halo regions. A dopant opposite the n- or p-type dopant used in the halo region is implanted in and diffused throughout only the first amorphous regions to create extension source and drain regions. Dielectric spacers are formed adjacent the sidewall insulators and second amorphous regions are created adjacent each of the dielectric spacers to a depth greater than the halo regions. A dopant opposite the n- or p-type dopant used in the halo region is implanted in and diffused throughout only the second amorphous regions to create source and drain regions.

The diffusion of dopant in the first and second amorphous regions may be by laser annealing to locally melt only the amorphous region. Preferably, the first amorphous regions and the dopant diffused therethrough extend beneath the sidewall insulators and the second amorphous regions and the dopant diffused therethrough do not extend beneath the sidewall insulators. The halo region may be doped with a p-type dopant and the first and second amorphous regions may be doped with an n-type dopant to create an NFET, or the halo region may be doped with an n-type dopant and the first and second amorphous regions may be doped with a p-type dopant to create a PFET. Preferably, each of the halo regions and the source and drain regions have substantially uniform depths.

The invention also includes a FET made by the aforementioned methods.

In another aspect, the present invention provides a FET comprising a substrate, a dielectric layer over a portion of the substrate, a gate over the dielectric layer and sidewall insulators on either side of and adjacent the dielectric layer and gate. Halo regions comprising an n- or p-type dopant extend to a desired depth in the substrate adjacent each of the sidewall insulators and beneath a portion of the dielectric layer. Extension source and drain regions are provided within a portion of each of the halo regions having a depth less than the halo regions. The extension source and drain regions are doped with a dopant opposite the n- or p-type dopant used in the halo region. Dielectric spacers are adjacent the sidewall insulators and source and drain regions are provided adjacent the dielectric spacers having a depth greater than the halo regions. The source and drain regions are doped with a dopant opposite the n- or p-type dopant used in the halo region. Preferably, the extension source and drain regions extend beneath the sidewall insulators and the deeper source and drain regions do not extend beneath the sidewall insulators. It is also preferred that the halo regions and the source and drain regions have substantially uniform depths.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
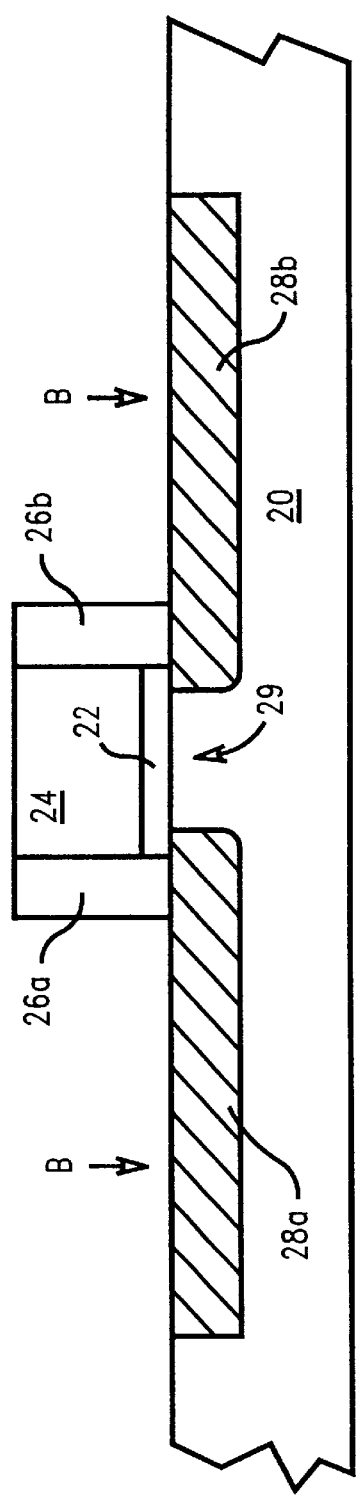
FIG. 1 is an elevational view of an initial stage in the preferred process of the present invention showing a transistor with adjacent amorphous silicon regions.

In describing the preferred embodiment of the present invention, reference will be made herein to FIGS. 1–3 of the drawings in which like numerals refer to like features of the invention. Features of the invention are not necessarily shown to scale in the drawings.

To solve the aforedescribed problems of the prior art, it has been unexpectedly discovered that a very narrow, very abrupt halo profile would mitigate the unwanted roll-up phenomenon. However, since it has also been found that conventional ion implant and annealing processes have difficulty producing the ideal halo profile, the present invention also provides a method to produce such an ideal halo profile.

Figure 2:
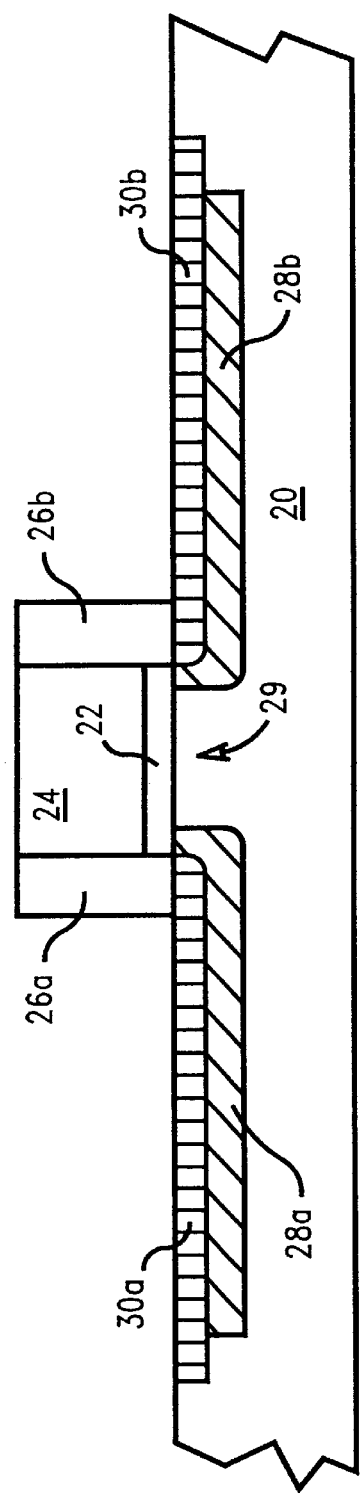
FIG. 2 is an elevational view of a later stage of the process depicted in FIG. 1 showing the boron halo region and a more shallow n-type doped region.
Figure 3:
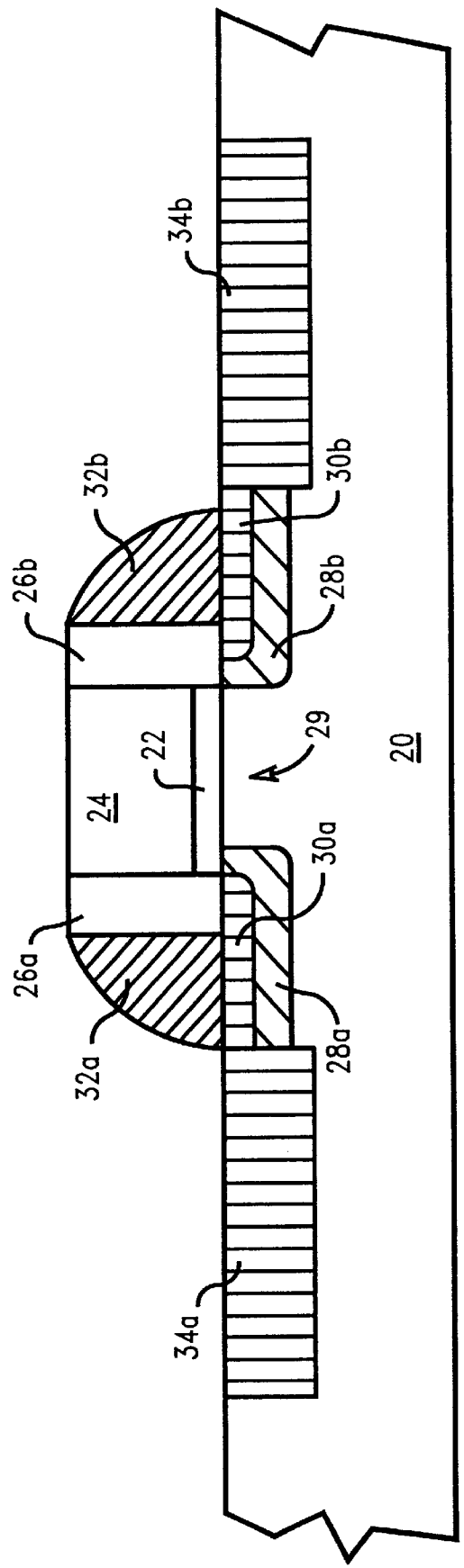
FIG. 3 is an elevational view of a later stage of the process depicted in FIG. 2 showing the dielectric spacers on the transistor gate sidewalls and a deeper n-type doped region.

An example of the processing performed on an FET is shown in FIGS. 1–3. In FIG. 1, there is initially provided by otherwise well-known and conventional methods a semiconductor substrate 20 of bulk single crystal silicon or silicon-on-insulator (SOI) having thereon a dielectric layer 22 of, for example, silicon dioxide, and a gate 24 of polycrystalline silicon (polysilicon) over the dielectric layer. Sidewall oxide insulators 26a, 26b are provided on either side of the dielectric layer 22 and gate 24 to define the FET. The process to which the present invention is particularly directed begins after the sidewall oxidation of the polysilicon gate of the FET. A mask is patterned to expose either the n-type or p-type FETs, and the process is the same except for the polarity of the dopant species used. This example will utilize NFETs, although PFETs may also be made in an analogous manner.

Initially, as shown in FIG. 1, an amorphizing implant of silicon or germanium is performed through the surface of substrate 20 to a depth of 50 nm, which produces amorphous silicon regions 28a, 28b of the same depth on either side of and adjacent to sidewalls 26a, 26b. Each amorphous region also extends approximately 25 nm laterally beneath sidewalls 26a, 26b and dielectric layer 22 into channel region 29 below gate 24. Boron B is then implanted within the amorphous silicon regions 28a, 28b by ion implantation for very precise dose control to form a p-type halo region. The boron dose is approximately $1 \times 10^{13}$ atoms/sq.cm. This is followed by a PGILD anneal step by melting only the amorphous silicon regions 28a, 28b with the laser. Since the dopant is redistributed within the silicon melt, this produces a halo region of nearly constant concentration, between $1 \times 10^{17}$ to $5 \times 10^{18}$ atoms/cm$^3$, coincident with the amorphous regions 28a, 28b. It is important that the power of the laser during PGILD laser annealing (melting) of the amorphous silicon is carefully controlled so that the gate 24 and gate oxide 22 are not melted.

Following the anneal process, a second amorphizing implant is made in the manner described previously, except that it is made only partially, i.e., about 20 nm deep or halfway, into halo regions 28a, 28b (FIG. 2). This second implant to create amorphous regions extends laterally, approximately 10 nm, beneath sidewalls 26a, 26b, but does not extend completely through the lateral portion of regions 28a, 28b beneath dielectric layer 22. An n-type PGILD process of arsenic or phosphorous implanting followed by local laser annealing (melting) of only the second amorphous region is used to create high concentration n-regions 30a, 30b essentially only in the second amorphous regions. Concentration after annealing is about $1\times10^{20}$ atoms/cm$^3$. These n-type regions 30a, 30b create extension source and drain regions and are precisely positioned relative to and within p-type halo regions 28a, 28b by the difference in ion implant energy, i.e., by utilizing a lower energy. Since diffusivity (Dxt) is kept small because of the very short PGILD anneal time, the junction profiles do not vary with subsequent PGILD anneals.

A dielectric spacer 32a, 32b of, for example, silicon nitride, is formed on each of the polysilicon sidewalls 26a, 26b as shown in FIG. 3. The size of the spacer needed depends on the junction depth required, and may be determined without undue experimentation. For this example, a spacer 32a, 32b width of 50 nm may be used. Thereafter, a third and final amorphizing implant is made in the manner previously described to create amorphous regions 34a, 34b. These last amorphous regions extend to a depth beyond the depth of the initial amorphous regions 28a, 28b, for example, about 50 nm–100 nm, preferably 75 nm. However, the width of the dielectric spacers 32a, 32b prevents the amorphous regions 34a, 34b from extending laterally beneath sidewalls 26a, 26b into channel region 29. Thereafter, a high concentration n-type diffusion is made with arsenic or phosphorous using the aforedescribed PGILD process within substantially only the amorphous regions 34a, 34b. Concentration after annealing is about $2\times10^{20}$ atoms/cm$^3$. This forms deeper source and drain junctions 34a, 34b and completes the FET. Because of the lateral diffusion effect previously discussed, a deeper junction requires a larger dielectric spacer to keep the deep part of the junction adequately spaced laterally from channel region 29 below gate oxide 22.

Thus, the present invention provides an abrupt, lightly doped, deep halo design for FETs. These halos are oppositely doped from the junctions, are self aligned to the gate and have a profile that is uniform with depth. This was not able to be achieved using prior art methods because if the halo was made too deep, it would extend into the channel region. The method and structure of the present invention overcomes the problem of roll-up phenomena, including short channel effect and threshold voltage decrease with decreasing channel length, and results in superior transistor performance.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for fabricating FETs with abrupt halos comprising:

providing an initial FET structure having a substrate, a dielectric layer over a portion of the substrate, a gate over the dielectric layer, sidewall insulators on either side of and adjacent the dielectric layer and gate;

forming halo regions comprising an n- or p-type dopant in the initial FET by creating initial amorphous regions in said substrate adjacent the sidewall insulators using ion implantation, and implanting an n- or p-type dopant within the initial amorphous regions and diffusing the dopant throughout substantially only in the initial amorphous regions by a first laser annealing to locally melt only the initial amorphous region to create said halo regions, said halo regions extending to a desired depth in the substrate adjacent each of the sidewall insulators and beneath a portion of the dielectric layer;

creating first amorphous regions within a portion of each of the halo regions to a depth less than the halo regions;

implanting in and diffusing throughout only the first amorphous regions a dopant opposite the n- or p-type dopant used in the halo region by a second laser annealing to locally melt only the first amorphous regions to create extension source and drain regions;

forming dielectric spacers adjacent the sidewall insulators;

creating second amorphous regions adjacent each of the dielectric spacers to a depth greater than the halo regions; and implanting in and diffusing throughout only said second amorphous regions a dopant opposite the n- or p-type dopant used in the halo region by a third laser annealing to locally melt only the second amorphous regions to create source and drain regions.

2. The method of claim 1 wherein said first amorphous regions and the dopant diffused therethrough extend beneath said sidewall insulators.

3. The method of claim 1 wherein said second amorphous regions and the dopant diffused therethrough do not extend beneath said sidewall insulators.

4. The method of claim 1 wherein the halo region is doped with a p-type dopant and said first and second amorphous regions are doped with an n-type dopant to create an NFET.

5. The method of claim 1 wherein the halo region is doped with an n-type dopant and said first and second amorphous regions are doped with a p-type dopant to create a PFET.

6. The method of claim 1 wherein each of the halo regions and the source and drain regions have substantially uniform depths.

7. A method for fabricating FETs with abrupt halos comprising:

providing an initial FET structure having a substrate, a dielectric layer over a portion of the substrate, a gate over the dielectric layer, sidewall insulators on either side of and adjacent the dielectric layer and gate;

creating initial amorphous regions in said substrate adjacent the sidewall insulators using ion implantation;

implanting an n- or p-type dopant within the initial amorphous regions;

diffusing the dopant throughout substantially only the initial amorphous regions by laser annealing to locally melt only the initial amorphous region to create halo regions extending to a desired depth in the substrate adjacent each of the sidewall insulators and beneath a portion of the dielectric layer;

creating first amorphous regions within a portion of each of the halo regions to a depth less than the halo regions;

implanting in and diffusing throughout only the first amorphous regions a dopant opposite the n- or p-type dopant used in the halo region to create extension source and drain regions;

forming dielectric spacers adjacent the sidewall insulators;

creating second amorphous regions adjacent each of the dielectric spacers to a depth greater than the halo regions; and implanting in and diffusing throughout only said second amorphous regions a dopant opposite the n- or p-type dopant used in the halo region to create source and drain regions.

8. The method of claim 7 wherein said first amorphous regions and the dopant diffused therethrough extend beneath said sidewall insulators.

9. The method of claim 7 wherein said second amorphous regions and the dopant diffused therethrough do not extend beneath said sidewall insulators.

10. The method of claim 7 wherein the halo region is doped with a p-type dopant and said first and second amorphous regions are doped with an n-type dopant to create an NFET.

11. The method of claim 7 wherein the halo region is doped with an n-type dopant and said first and second amorphous regions are doped with a p-type dopant to create a PFET.

12. The method of claim 7 wherein each of the halo regions and the source and drain regions have substantially uniform depths.

* * * * *